March 3, 1959 J. D. McWILLIAMS 2,875,717

DIP SOLDERING MACHINE

Filed Aug. 23, 1955 2 Sheets-Sheet 1

INVENTOR.
JAMES D. McWILLIAMS
BY H. W. Brelsford
ATTORNEY

March 3, 1959 J. D. McWILLIAMS 2,875,717

DIP SOLDERING MACHINE

Filed Aug. 23, 1955 2 Sheets-Sheet 2

INVENTOR.
JAMES D. McWILLIAMS
BY H. W. Brelsford
ATTORNEY 2,875,717

DIP SOLDERING MACHINE

James D. McWilliams, Santa Barbara, Calif., assignor, by mesne assignments, to Jefferson Electronic Products Corporation, Santa Barbara, Calif., a corporation of California Application August 23, 1955, Serial No. 530,013

8 Claims. (Cl. 113—59)

Figure 1:
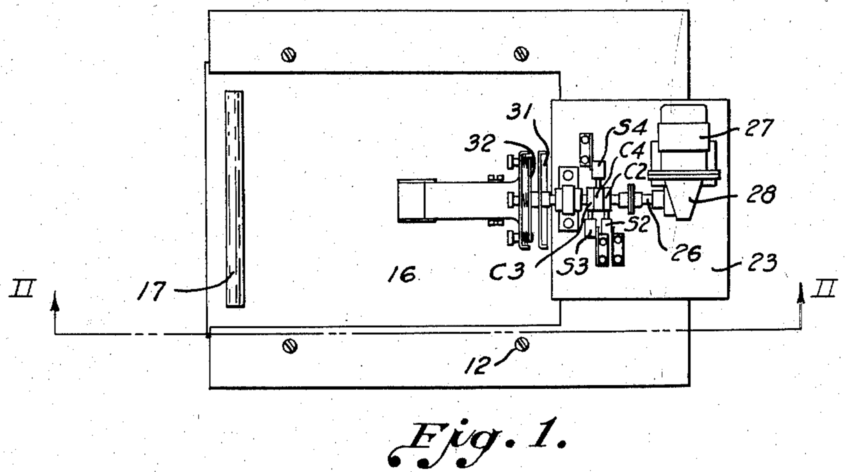

This invention relates to assembly of electronic circuits and has particular reference to a power operated soldering machine for dip soldering one surface of an insulating board upon which circuit components are placed.

The assembly of electronic circuits is undergoing a rapid revolution from hand soldering technics toward fully automatic assembly by machines. One of the developments currently holding out considerable promise is the use of printed circuits. The present invention contemplates the soldering of a printed circuit of the type wherein conductor strips are secured to one surface of an insulating board and circuit components such as resistors, capacitors, inductors, transformers, switches, etc. are mounted on the other surface of the board at selected positions to intersect selected conductors. Leads from the circuit components on the other side of the board project through these holes. By placing the conductor side of a board on the surface of a bath of molten solder the circuit components are electrically bonded together. Solder from the bath adheres to the conductors and leads and joins them together electrically. Frequently also, these solder joints act as the means of mechanically mounting the components on the board by securely gripping their leads at the holes intersecting the conductors.

It is well known in the printed circuit art that the insulating board (frequently formed of thermo-setting plastic sheet material) must be presented at an angle to the surface of the solder bath, rather than parallel to the surface. This angular presentation shoves aside the film of oxidation or dross which is ever present on a bath of molten solder. The conductors thereupon contact clean molten solder whereas parallel immersion would trap much dross on the underside of the board, resulting in poor solder connections.

The "dwell time" of solder dipping is also important as too little time results in poor "cold" solder connections and too long a time causes excessive heating of the leads (with probable damage to components) and also results in "thin" solder connections.

The present invention provides for presentation of the board at an angle to the solder bath, closely controls dwell time, and removes the board from the bath at an angle to aid in obtaining a uniform dwell time. Maximum speed of operation is assured by a fast cycle during the non-soldering portion of the machine operation, and a slow speed operation during the soldering portion of the machine cycle. The work holder is adjustable to align the printed circuit board with the solder bath surface. Safety controls are provided for manual feeding of the machine so that the operator cannot be injured by the molten solder. Automatic stop controls are provided to permit removal of the completed work piece and insertion into the work holder of a new piece to be soldered.

It is a general object of the invention to provide an improved machine for dip soldering printed circuit boards.

Another object is to provide a dip soldering machine that presents a work board at an angle to the solder surface.

A further object is to provide a dip soldering machine that is fast in operation during the non-soldering portion of its cycle, and closely controlled in the timing of the soldering portion of the cycle.

Figures 2, 3, 4:
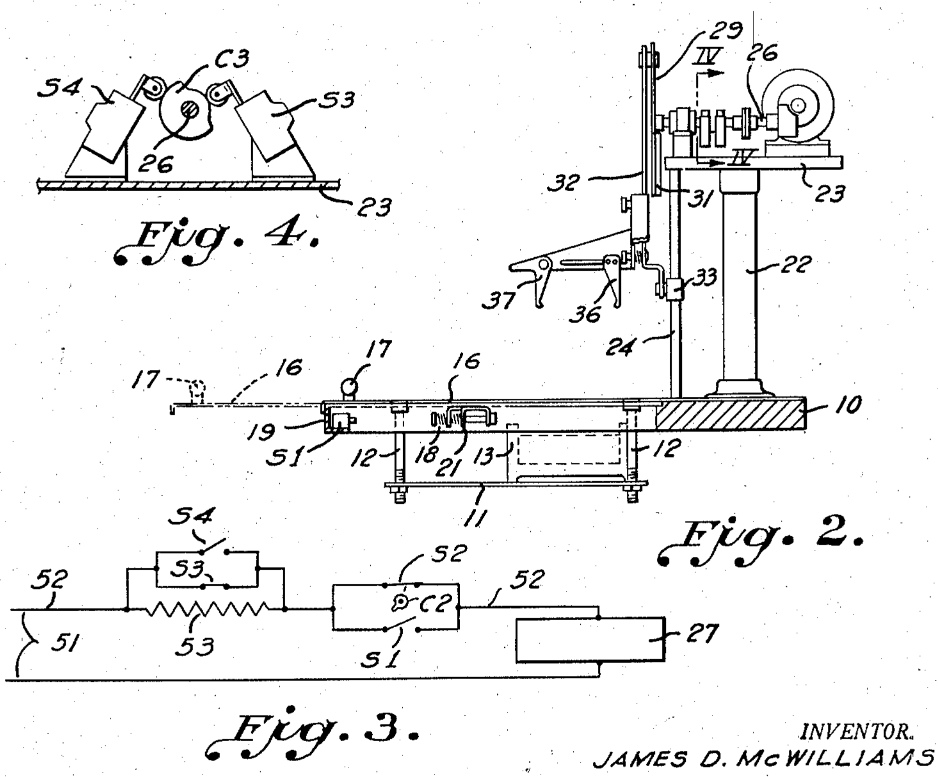
Figure 7:
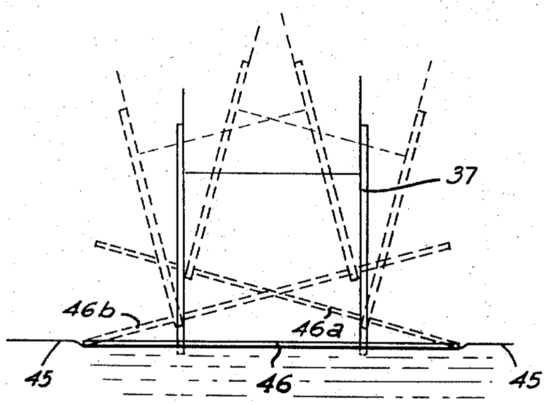
Figure 5:
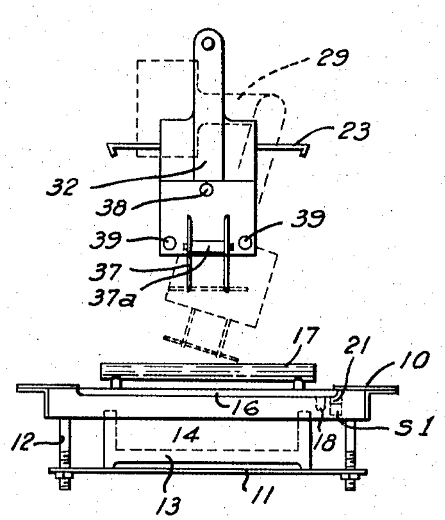
Figure 6:
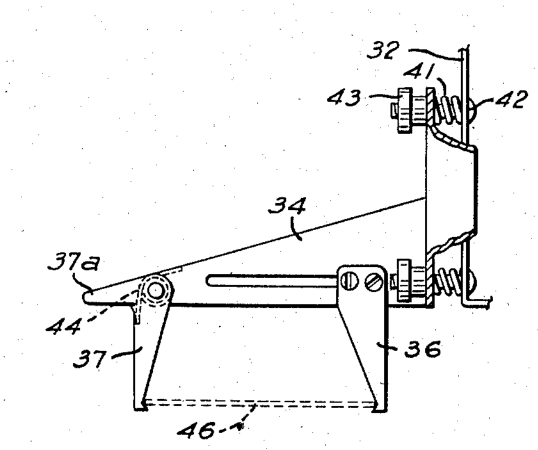

Other objects and advantages of this invention will be apparent in the following description and claims considered together with the drawings forming an integral part of this specification in which:

Fig. 1 is a plan view of apparatus embodying the invention,

Fig. 2 is an elevation view partly in section taken along the line II—II of Fig. 1, Fig. 3 is a wiring schematic diagram for the electrical circuit of the disclosed embodiment of the invention, Fig. 4 is an enlarged view of the cam operated switches taken along the line IV—IV of Fig. 2, Fig. 5 is a front view of the apparatus of Figs. 1 and 2, Fig. 6 is an enlarged fragmentary view partly in section of the work holder of the apparatus, and Fig. 7 is an enlarged diagrammatic view with exaggerated angles showing the presentation of the work piece to the bath of molten solder.

Referring to the drawing the invention may be disposed on a bench top 10, having a platform 11 adjustably suspended therefrom by bolts 12. An open top container 13 for molten solder may rest upon this platform. This container 13 or solder pot may be suitably heated (not shown), as by electricity, to maintain a molten bath 14 of solder. Slidably disposed over the pot 13 may be a cover plate 16 which may have a handle 17 for ease in manually grasping and moving the cover plate 16.

Carried by the bench top 10 may be a normally open switch S1. This is closed only after a compression spring 18, carried by the sliding cover 16, is manually compressed against an angle iron 19. A finger 21 carried to one side of the compression spring contacts the switch S1 to close it. The finger 21 may also be carried by the cover plate 16. Thus a strong manual pull to compress spring 18 is necessary to close switch S1, and release of manual pressure permits the compression spring 18 to move the cover plate to the right (in Figs. 1 and 2) a fraction of an inch whereupon the switch S1 opens. The cover plate however still exposes the bath of molten solder in this condition and a manual shoving of the cover plate 16 to the right (in Figs. 1 and 2) is necessary to cover over the solder pot 13.

Mounted on the table 10 may be a pedestal 22 supporting a horizontal motor platform 23. Extending upwardly from the table 10 adjacent to the solder pot 13 is a vertical guide rod 24 which may be suitably secured at its upper end as by fastening to the motor platform 23. Mounted for rotation on the platform 23 may be a horizontal shaft 26 disposed adjacent to the upper end of the guide rod 24, or the projection of this guide rod 24. This shaft may be driven in rotation by a motor, such as an electrical motor 27, having any suitable gear reduction 28 to achieve shaft speeds in the range of one to 10 R. P. M.

Secured to an end of shaft 26 which overhangs the motor platform 23 may be a crank arm 29 suitably counterbalanced, if desired, by a counter weight 31. Pivoted to the outer end of crank arm 29 is a connecting rod 32, the other end of which may be pivoted to a sliding guide 33 on the vertical guide rod 24. Rotation of the shaft 26 causes this connecting rod to oscillate in a vertical plane as well as to tilt through an angle determined by its length and the throw of the crank arm 29. It has been found that an angle of 15° is satisfactory, for a total angular movement of 30°.

Mounted on the connecting rod 32 is a work holder including a base 34, a pair of stationary but adjustable fingers 36, and a pair of spring biased pivoted fingers 37. The base 34 may have a tripod mounting on the connecting rod 32 including one upper mounting 38 and two lower mountings 39. These mountings are shown best in enlarged Fig. 6 wherein a compression spring 41 may be placed between the base 34 and the connecting rod 32 and positioned by a bolt 42 passing through all three members and secured by a nut 43. The nut may compress the spring 41 to give any desired spacing of the base to the connecting rod at the tripod mounting points.

The pivoted fingers may be spring biased to rotate counterclockwise in Fig. 6 and for this purpose a torsion spring 44 (Fig. 6) may interconnect the fingers 37 and the base 34. Preferably the fingers 37 move in unison and may be joined, for example, by a grip strip **37*a*. The pivoted fingers 37 may clamp a work piece 46 between them and the stationary fingers 36. The work piece 46 may have a printed circuit on its lower surface and soldering of components may be accomplished by exposing the lower surface of this board 46 to the molten solder. The work holder is adjustable to accommodate work sheets or boards of varying width, by sliding the stationary fingers 36 right or left (Fig. 6). A slot 47 is provided on each side of the base 34, and screws 48 passing through the fingers 36 and these slots, hold the fingers to the base. By loosening the screws 48** the fingers may be slid to the desired position and fastened there by tightening the screws or any nuts associated therewith.

The presently preferred circuit for operating the disclosed embodiment of the invention is illustrated in Fig. 3 where a source of current is indicated at 51. A conductor 52 leading therefrom to the motor 27 has an impedance 53 in series and switch S1 in parallel with a switch S2. A shunt around impedance 53 may include two switches S3 and S4 in parallel. The impedance 53 results in slow speed operation of the motor 27 unless it is shunted by closing one of switches S3 or S4.

The mechanism of switches S2, S3 and S4 is illustrated best in Figs. 1 and 4 wherein is disclosed a plurality of rotating cams C2, C3 and C4 respectively mounted on the horizontal shaft 26. These cams operate their switches at selected points in the cycle. Cam C2 opens switch S2 at the top of the dipping cycle, which position is illustrated in Fig. 5. Since switch S1 is normally open the motor stops. Momentarily closing switch S1 causes rotation of shaft 26, causing switch S2 to close, insuring actuation of the motor 27 until completion of that cycle. The normally closed switch S3 shunts impedance 53 and the motor operates at full speed until it approaches the point of actual dip soldering. Cam C3 thereupon opens switch S3 causing the motor to operate slowly. At the completion of dipping, switch S4 closes, giving fast operation of the motor.

The action of the invention in dipping the board 46 is illustrated in Fig. 7 wherein the angles are exaggerated. The pivoted fingers 37 are there illustrated as holding the board, and the solid outline shows the board at the mid point of the dip soldering, the position **46*a* shows the beginning, and 46*b* the end of the dipping operation. The actual angles of positions 46*a* and 46*b* with the liquid solder surface 45 are more on the order of 2° to 6° but Fig. 7 clearly illustrates the shoving of dross to the left by the board 46*a* touching the liquid surface. The actual depth of immersion is not critical since the solder bath has a very large meniscus. The solder pot 13 may be raised and lowered by bolts 12 if the meniscus range is exceeded. The removal of the work piece 46 at an angle illustrated at 46*b* (Fig. 7) gives a uniform time of exposure to the solder for the entire under surface of the board 46**, the entering edge, which gets the first exposure, being the first to leave.

The operation of the device is initiated by the operator grasping the cover plate handle 17 and pulling the cover plate away from the pedestal 23 to expose the bath 14 of molten solder. The spring 18 (Fig. 2) cushions the stop and when fully compressed permits finger 21 to close switch S1 (see Fig. 3 also). The motor 27 is then energized and operates rapidly to rotate crank arm 29 to push connecting rod 32 downwardly until the work piece 46 (Fig. 6) approaches the solder surface. Switch S3 is then opened by cam C3 and the impedance 53 is then in series, reducing motor speed. The work piece board 46 enters at an angle (Fig. 7) as shown at **46*a*, shoving dross to the left to expose bright clean solder. The board lower surface is then in contact with the solder for a time determined by motor speed and the limit cams C3 and C4. At the end of the dip, the cam C4 closes switch S4, shunting impedance 53 until the top dead center position is reached (Fig. 5) whereupon cam C2 opens switch S2, stopping the motor. Normally open switch S1 will be open because of compression spring 18** inching the cover to the right as the operator relaxes his grip.

It will be apparent to those skilled in the art that various modifications may be made in the disclosed embodiment without departing from the true spirit and scope thereof. Various mechanisms may be employed to control the fast and slow positions of the cycle. Various circuits may be used and various mechanical constructions may be employed. For these and other reasons, all such modifications are included except as the claims otherwise limit this invention.

What is claimed is:

1. A dip soldering machine for printed circuits comprising: an open top container for a molten solder bath; a vertical guide rod disposed at one side of the solder container; a shaft mounted for rotation along a horizontal axis and disposed above the container and adjacent to the guide rod; a crank arm mounted on the shaft adjacent to the guide rod; a connecting rod pivoted at one end to the crank arm at a point removed from the shaft, sliding guide means slidably engaging the vertical guide rod, said connecting rod being pivoted at its other end to said sliding guide means; a work holder firmly mounted on the connecting rod to hold a work piece over the solder container; and motor means for rotating the shaft.

2. A soldering machine as defined in claim 1 wherein motor controls are provided to slow the motor during the part of the shaft rotation whereat the work holder is closest to the solder container.

3. A dip soldering machine as set forth in claim 1 wherein a cam is provided on the horizontal shaft and motor control means are actuated by the cam to stop the motor at a point in the shaft rotation other than when the work holder is closest to the solder container.

4. A dip soldering machine as set forth in claim 1 wherein the motor is an electric motor, an impedance is provided in the motor circuit, a switch is provided to shunt the impedance, and a cam is provided on the horizontal shaft to operate the switch to slow the motor during the soldering portion of the shaft rotation by placing the impedance in the motor circuit and to speed the motor operation during other portions of the shaft rotation by shunting the impedance.

5. A dip soldering machine as defined in claim 1 wherein a manually slidable cover is disposed over the solder container, the motor is an electric motor, and a starting switch is connected to the motor and is positioned to be actuated by the cover when the cover is manually pulled away from the solder container.

6. In a dip soldering machine having a solder pot, a rotatable horizontal shaft located above same, a crank arm on said shaft, vertically moving guide means located beneath said horizontal shaft and above said solder pot, and a connecting rod pivoted at one end to such crank arm and at the other end to said guide means for movement in a vertical plane, a work holder mounted on the connecting rod comprising: a base member, three triangle spaced mounting bolts on said base for connection to said connecting rod, compression springs disposed around the bolts for positioning between the base and the connecting rod, a pair of stationary fingers adjustably mounted on the base and adjustable to different positions on the base along a horizontal plane, and at least one pivoted work holding finger spring biased toward said stationary pair of fingers.

7. In a dip soldering machine having a solder pot, a rotatable horizontal shaft located above same, a crank arm on said shaft, vertically moving guide means located beneath said horizontal shaft and above said solder pot, a connecting rod pivoted at one end to such crank arm and at the other end to said guide means for movement in a vertical plane, and a protective cover slideably mounted over said solder pot, an electric circuit for a motor connected to the shaft comprising: a source of potential, an electric motor, an impedance connected between said source and said motor; a switch shunting the impedance, a pair of parallel switches disposed in series with the impedance between said source and said motor; a cam means operated by the shaft to open one of said parallel switches for a short portion only of the arm rotation at a rotation point when the work holder is not close to the solder pot; the other one of said parallel switches being located adjacent to said sliding cover and being adapted to be engaged by a portion thereof when said sliding cover is moved to open position; a spring disposed adjacent said other parallel switch which is normally open so that only a strong manual pull on the sliding cover will momentarily close that switch to complete a circuit to the motor when the cam operated switch is open; and cam means operated by said shaft when the work holder is close to the solder pot to open the switch shunting the impedance to slow the motor during the soldering operation.

8. In a dip soldering machine having a solder pot, a rotatable horizontal shaft located above same, a crank arm on said shaft, a vertically moving guide means located beneath said horizontal shaft and above said solder pot, a connecting rod pivoted at one end to such crank arm and at the other end to said guide means for movement in a vertical plane, and a work holder mounted on said connecting rod, and wherein a protective cover moves over a solder pot, an electric circuit for a motor coupled to the shaft comprising: a source of potential; an electric motor; a pair of parallel switches disposed in series between said source and said motor, one switch being normally closed and the other being normally open; cam means operated by the shaft to open one of said parallel switches at a time when the work holder is not close to the solder pot and for a short duration only; and a spring normally holding open the other of said parallel switches, said other switch being closed by the moving of the cover off of the solder pot so that the motor is started only when the pot is uncovered.

References Cited in the file of this patent

UNITED STATES PATENTS

| | | |
|---|---|---|
| 2,442,183 | Stearns | May 25, 1948 |
| 2,671,264 | Pessel | Mar. 9, 1954 |
| 2,685,271 | Essen | Aug. 3, 1954 |
| 2,704,993 | Davis | Mar. 29, 1955 |
| 2,724,392 | Cooper | Nov. 22, 1955 |